United States Patent
Li

(10) Patent No.: US 8,063,481 B2
(45) Date of Patent: Nov. 22, 2011

(54) HIGH-SPEED MEMORY PACKAGE

(75) Inventor: Ming Li, Fremont, CA (US)

(73) Assignee: Rambus Inc., Sunnyvale, CA (US)

( * ) Notice: Subject to any disclaimer, the term of this patent is extended or adjusted under 35 U.S.C. 154(b) by 7 days.

(21) Appl. No.: 12/526,234

(22) PCT Filed: Feb. 20, 2008

(86) PCT No.: PCT/US2008/054455
§ 371 (c)(1),
(2), (4) Date: Aug. 6, 2009

(87) PCT Pub. No.: WO2008/103752
PCT Pub. Date: Aug. 28, 2008

(65) Prior Publication Data
US 2010/0320602 A1 Dec. 23, 2010

Related U.S. Application Data

(60) Provisional application No. 60/891,010, filed on Feb. 21, 2007.

(51) Int. Cl.
*H01L 21/00* (2006.01)
(52) U.S. Cl. ........ 257/700; 257/713; 257/720; 257/723; 257/E23.039; 257/E23.083
(58) Field of Classification Search .......... 438/106–127, 438/464; 257/678, 685, 686, 778, 784–787, 257/E21.002, 504, 23.008, 64–69, 172, 177, 257/25.013–23, 691–734, E23.039, 83, 189
See application file for complete search history.

(56) References Cited

U.S. PATENT DOCUMENTS 5,099,309 A * 3/1992 Kryzaniwsky ................ 361/718
5,122,475 A * 6/1992 Heckaman et al. ........... 438/107
(Continued)

FOREIGN PATENT DOCUMENTS
EP 0637871 A 2/1995

OTHER PUBLICATIONS

International Search Report and Written Opinion issued in PCT/US2008/054455, Jun. 24, 2008, 9 pages by ISA/EP.

*Primary Examiner* — Michael Lebentritt
(74) *Attorney, Agent, or Firm* — Morgan, Lewis & Bockius LLP

(57) ABSTRACT

The semiconductor package includes a dielectric layer, a trace layer, a conductive layer, a die and an underfill layer. The dielectric layer has first side and an opposing dielectric layer second side. Multiple vias extend through the dielectric layer from the dielectric layer first side to the dielectric layer second side. Multiple solder balls are disposed at the dielectric layer second side. Each of the solder balls is electrically coupled to a different one of the vias. The die is electrically coupled to the solder balls. The conductive layer is disposed between the dielectric layer second side and the die. The conductive layer defines a window there through for allowing the solder balls to electrically couple to the vias without contacting the conductive layer, i.e., no physical or electrical contact. The underfill layer is formed between the die and the conductive layer, while the trace layer is formed at the dielectric layer first side. Traces of the trace layer electrically couple the vias to other solder balls.

28 Claims, 3 Drawing Sheets

U.S. PATENT DOCUMENTS

| | | | | |
|---|---|---|---|---|
| 5,227,338 A | * | 7/1993 | Kryzaniwsky | 29/841 |
| 5,280,192 A | * | 1/1994 | Kryzaniwsky | 257/723 |
| 6,225,694 B1 | | 5/2001 | Terui | 257/704 |
| 6,338,985 B1 | * | 1/2002 | Greenwood | 438/126 |
| 6,376,769 B1 | * | 4/2002 | Chung | 174/524 |
| 6,534,861 B1 | * | 3/2003 | Castro | 257/734 |
| 7,429,786 B2 | * | 9/2008 | Karnezos et al. | 257/686 |
| 2001/0002321 A1 | * | 5/2001 | Castro | 438/122 |
| 2003/0230801 A1 | * | 12/2003 | Jiang et al. | 257/723 |
| 2003/0230802 A1 | * | 12/2003 | Poo et al. | 257/734 |
| 2004/0240191 A1 | | 12/2004 | Arnold et al. | 361/800 |
| 2007/0034519 A1 | * | 2/2007 | Chinda et al. | 205/125 |
| 2008/0001268 A1 | * | 1/2008 | Lu | 257/678 |
| 2008/0003720 A1 | * | 1/2008 | Lu et al. | 438/113 |
| 2009/0102035 A1 | * | 4/2009 | Hedler et al. | 257/686 |
| 2010/0246152 A1 | * | 9/2010 | Lin et al. | 361/783 |

* cited by examiner

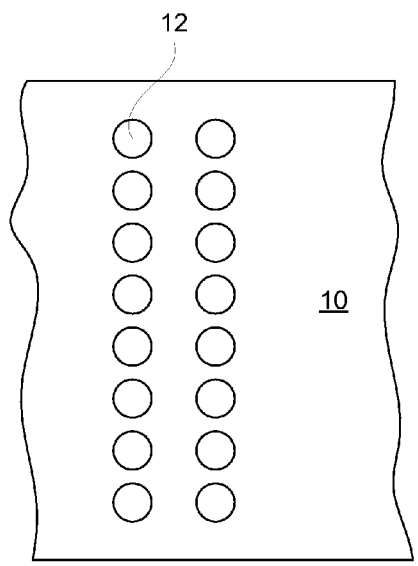
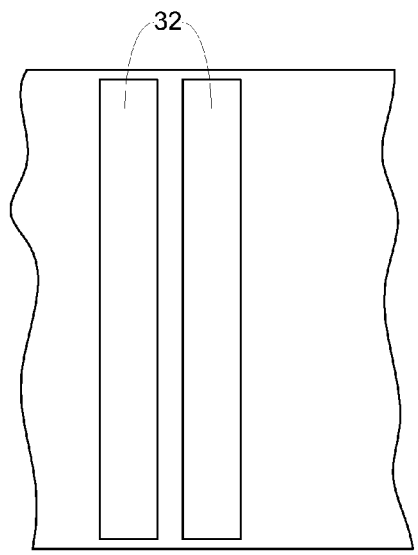
FIG. 2
FIG. 3
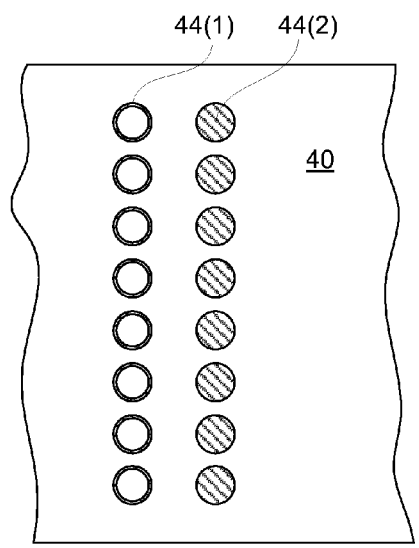
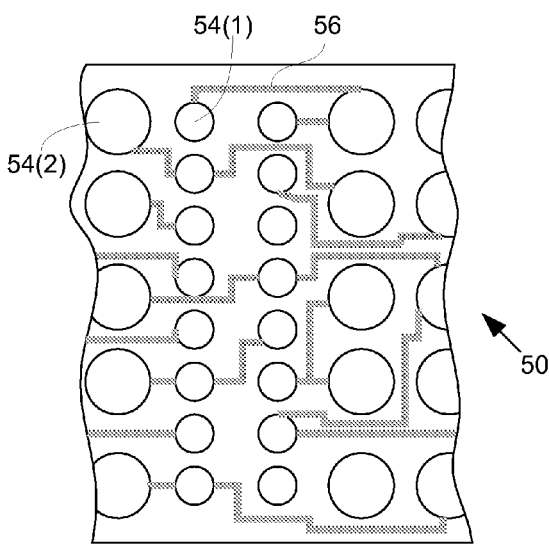
FIG. 4
FIG. 5

HIGH-SPEED MEMORY PACKAGE

CROSS REFERENCE TO RELATED APPLICATIONS

This Application is a United States National Stage Application filed under 35 U.S.C. §371 of PCT Patent Application Serial No. PCT/US2008/054455 filed on Feb. 20, 2008, which claims the benefit of and priority to U. S. Provisional Patent Application Ser. No. 60/891,010 filed on Feb. 21, 2007, the disclosures of all of which are hereby incorporated by reference in their entirety.

BACKGROUND

The disclosure herein relates to a multi-layered semiconductor package, and more particularly to a memory package that includes a conductive layer defining a window there through.

Semiconductor packages are enclosures that house one or more semiconductor die. A semiconductor die is typically a single square or rectangular piece of semiconductor material in which various microelectronic circuits have been formed. A memory package serves to both protect the die contained therein from physical and environmental damage and to physically and electrically connect the die to a printed circuit board (PCB).

Recently, the demand for higher-speed signals within memory packages has created a need for a ground plane within the package to shield the circuitry. However, the longer the interconnections between the die and the PCB, the higher the impedance, which can lead to signal integrity problems, particularly for high-speed signals.

Flip-chip packages have been developed to provide short electrical interconnection lengths, but traditional flip-chip packages utilize expensive, thick build-up substrate layers to provide mechanical stability and high density signal routing. These packages are complex to design and manufacture.

It is therefore desirable to provide a grounded, electromagnetically shielded package that is thin and has short electrical interconnection lengths without compromising the mechanical strength of the package.

BRIEF DESCRIPTION OF THE DRAWINGS

For a better understanding of the nature and objects of the invention, reference should be made to the following detailed description taken in conjunction with the accompanying drawings, in which:

FIG. 2 is a view taken along line II-II of FIG. 1;
FIG. 3 is a view taken along line III-III of FIG. 1;
FIG. 4 is a view taken along line IV-IV of FIG. 1;
FIG. 5 is a view taken along line V-V of FIG. 1.

Like reference numerals refer to the same or similar components throughout the several views of the drawings.

DETAILED DESCRIPTION

The exemplary embodiments described below address the problems of the prior art by providing a multi-layered semiconductor package having a die, a dielectric layer, an electrical path, and a conductive layer. The die includes an electrical connector. The dielectric layer includes a dielectric layer first side and an opposing dielectric layer second side. The electrical path extends through the dielectric layer from the dielectric layer first side to the dielectric layer second side. The conductive layer is disposed between the die and the dielectric layer first side. The conductive layer defines a window there through for allowing the electrical connector to electrically couple to the electrical path without contacting the conductive layer. In some embodiments, the conductive layer is electrically and/or thermally conductive, acts as a mechanical stiffener, a ground plane, a power plane, or electromagnetic shield.

Figure 1:
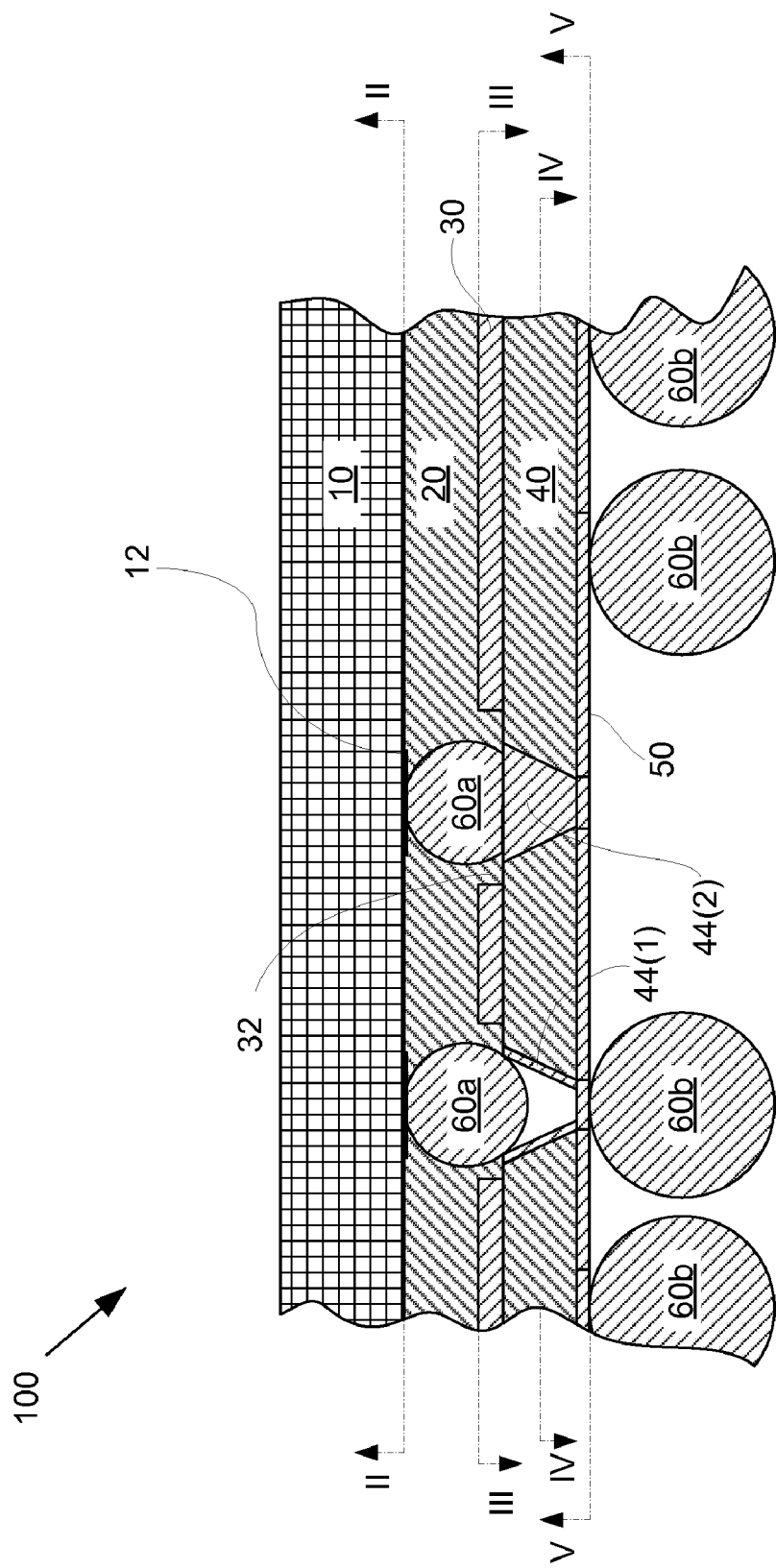
FIG. 1 is a cross-sectional view of a semiconductor package according to an exemplary embodiment.

FIG. 1 shows an exemplary embodiment of a semiconductor package 100. In some embodiments, the semiconductor package 100 includes a dielectric layer 40, an optional trace layer 50, a conductive layer 30, a die 10, and an optional underfill layer 20. The package 100 may also include more or less layers. The dielectric layer 40 has opposing first and second sides. The dielectric layer 40 may be made of any suitable material, such as, without limitation, polyimide, liquid crystal polymer (LCP), or a resin epoxy-based composite, such as Flame Resistant 4 (FR-4) or BT.

Multiple electrical paths 44, such as vias, extend through the dielectric layer from the dielectric layer first side to the dielectric layer second side. Multiple electrical connectors 60a, such as solder bumps or balls, are disposed near the dielectric layer second side. In general, each of the electrical connectors 60a is electrically coupled to a different one of the electrical paths 44. The die 10 is electrically coupled to the electrical connectors 60a. The conductive layer 30 is disposed between the dielectric layer 40 and the die 10, and in some embodiments, is formed on the dielectric layer second side. The conductive layer 30 defines one or more windows 32 there through for allowing the electrical connectors 60a to electrically couple to the electrical paths 44 without contacting the conductive layer 30, i.e., no physical or electrical contact with the conductive layer 30. The electrical connectors 60a are typically applied to the memory die 10 before the package is assembled. For example, when solder balls or bumps are used, the process is referred to as a bumping process.

The optional underfill layer 20 is formed between the die 10 and the conductive layer 30. The underfill layer 20 is made from a dielectric material, such as epoxy or the like.

The optional trace layer 50 is formed at the dielectric layer first side. Traces 56 (FIG. 5) of the trace layer 50 electrically couple the electrical paths 44 to other electrical connectors 60a. In some embodiments, the dielectric layer 40 and trace layer 50 together make up a flex tape, such as, without limitation, a copper/polyimide tape. The flex tape may have one or two metal layers and a solder mask on the metal layer.

In some embodiments, the package 100 is configured to electrically connect to a printed circuit board (PCB) (not shown) through one or more second electrical connectors 60b, such as solder balls/bumps. The second electrical connectors 60b are typically applied to the trace layer 50 at the end of the package assembly process, and may form a ball grid array (BGA) or the like.

In some embodiments, the semiconductor die 10 is a memory die, such as a random access memory (RAM) die. In these embodiments, the RAM die may be, without limitation, dynamic random access memory (DRAM), double data rate RAM (DDR), DDR2, DDRn, Rambus XDR DRAM, or graphics memory, such as, without limitation, graphics DDR (GDDR), GDDR2, GDDRn, or any other high speed DRAM that uses a multi-layer substrate.

FIG. 2 shows the bottom of the semiconductor die 10, as viewed from line II-II of FIG. 1. Inputs into the die and outputs out from the die may be electrically coupled to electrical contacts, such as solder pads 12. These electrical contacts are configured to electrically couple to the electrical connectors 60a. In some embodiments, the electrical contacts are arranged in a row as shown in FIG. 2.

FIG. 3 shows the top of the conductive layer 30, as viewed from line III-III of FIG. 1. The conductive layer 30 defines one or more windows 32 that extend entirely through the conductive layer, i.e., from one substantially planar side of the conductive layer to the other. It should be appreciated that the present invention is not limited to any specific number of windows 32. Indeed, FIG. 6, discussed below, shows an embodiment having three windows 32. Each window 32 is configured and dimensioned to allow an electrical path to be formed between the die 10 and the electrical paths 44 without the electrical connectors 60a (or the electrical paths 44) making physical contact with the conductive layer 30. In other words, each window 32 is configured such that electrical paths from the electrical contacts 60b to the die 10 are electrically isolated from the conductive layer 30. For example, in some embodiments, as shown in the Figures, the electrical connectors 60a are disposed in at least one row along the length of the window. The electrical connectors 60a are narrower than each window 32 so as to be physically and electrically isolated from the edge of the window 32, and thus from the conductive layer 30. Therefore, the electrical connectors 60a never touch the sides of the windows 32. In some embodiments, each window 32 is substantially rectangular, and has a length of between about 5 mm and 15 mm, and a width between about 0.10 mm and 3.0 mm.

Also in some embodiments, solder pads 12 on the die 10 and the electrical paths 44 through the dielectric layer 40 are disposed in one or more rows along the length of the windows 32. This ensures that the solder pads 12 and electrical paths 44 are also physically and electrically isolated from the conductive layer 30.

In some embodiments, the conductive layer 30 is a metal foil, such as a FeNi36 (Invar), Cu and/or Cu-Invar-Cu, or alloy 42 material. In some embodiments, the thickness of the conductive layer 30 is between about 5 microns and 150 microns. Also in some embodiments, the conductive layer 30 is formed on the dielectric layer 30 using any suitable technique.

FIG. 4 shows a cross-sectional view through the dielectric layer 40, as viewed from the line IV-IV of FIG. 1. As described above, the electrical paths 44 may be electrically conductive vias that electrically and mechanically connect to the electrical contacts 60b and the trace layer 50 (FIG. 1). In some embodiments, each via forms an electrically conductive path through the dielectric layer 40. In some embodiments, the vias have diameters of approximately 25-250 µm. In some embodiments, as shown, the vias are substantially frusto-conical, i.e., tapered with the diameter nearer the die 10 being larger than the diameter near the trace layer 50. Alternatively, the vias may be cylindrical or the like.

Each via may include a central, or "drill" portion formed using a number of techniques. For example, and without limitation, the via holes may be formed using various mechanical drilling, laser drilling, or photolithographic techniques. After the via holes have been formed in the various layers, one or more electrically conductive materials, such as copper or the like, are deposited into the via holes. The electrically conductive material may fill the via holes completely, as shown by reference numeral 44(2), or the electrically conductive material may only plate the walls of the via holes, leaving a hollow space in the electrically conductive material, as shown by reference numeral 44(1). In the case where the electrically conductive material only plates the via holes, the hollow space within the vias may be filled with various dielectric materials, or left hollow. The electrically conductive material may be applied or deposited in the via holes using a number of different techniques, including plating or paste filling. In some embodiments, the vias may be solid, formed, for example, using lithographic techniques.

FIG. 5 shows a view through the trace layer 50, as viewed from the line V-V of FIG. 1. In some embodiments, the trace layer 50 includes electrically conductive traces 56 electrically connected to first solder pads 54(1) that are aligned with and coupled to the electrical paths 44. The conductive traces 56 are also electrically connected to second solder pads 54(2) that are configured and dimensioned to mechanically and electrically connected to the electrical connectors 60b (FIG. 1). The traces 56 may be formed using photolithography, laser etching, or any other suitable method, and may be composed of various electrically conductive materials, such as copper or the like.

In some embodiments, in which the conductive layer 30 is used as a ground plane or a power plane, as will be described below, the conductive layer 30 may be electrically connected to the PCB (not shown) through electrical paths 44 through the dielectric layer, the trace layer, and the electrical connectors 60b. These electrical connections between the conductive layer 30 and the PCB (not shown) can include any appropriate electrically conductive elements, such as, without limitation, a combination of vias, traces, and solder balls/bumps similar to those described above. Regardless of their composition, these electrical interconnection paths are physically and electrically isolated from the electrical interconnection paths connecting the die 10 to the PCB (not shown).

Figure 6:
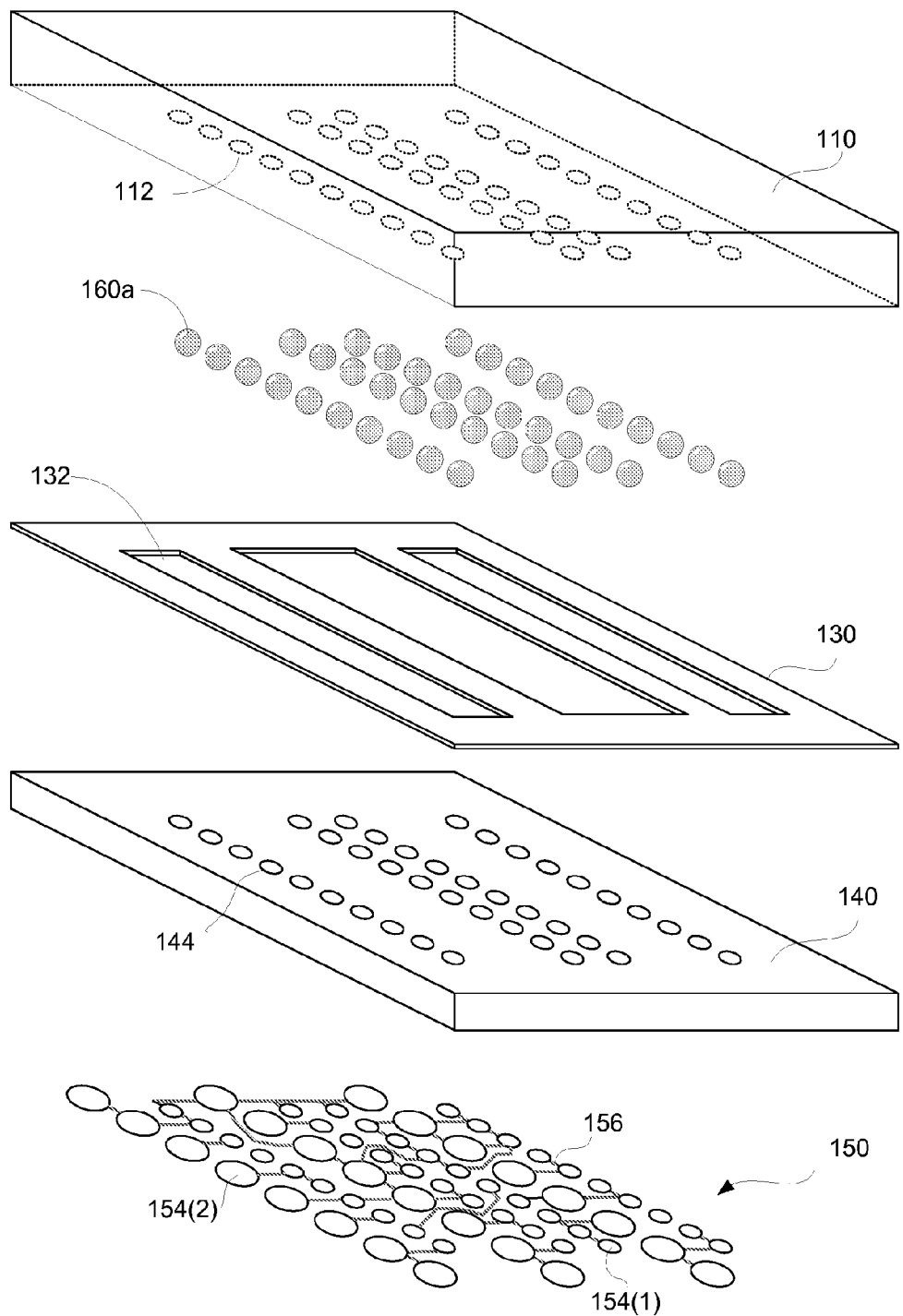
FIG. 6 is an exploded perspective view of a semiconductor package according to an exemplary embodiment.

FIG. 6 is an exploded perspective view of a semiconductor package according to another exemplary embodiment. The semiconductor package includes many of the same structures described above, including a semiconductor die 110, a conductive layer 130, a dielectric layer 140, and a trace layer 150. In this embodiment, however, the conductive layer includes three windows 132 configured and dimensioned for receiving at least four rows of solder balls or bumps 160a there through.

During manufacture of the die 110, solder balls or bumps 160a may be mechanically and electrically coupled to contact pads 112 on the underside of the die 110. For example, where the semiconductor package is a flip-chip, or Controlled Collapse Chip Connection (C4) memory package, that may or may not include any wire bonds, solder bumps are deposited on the chip pads 112 during the final wafer processing step.

During assembly of the package, the trace layer 150 and the conductive layer 130 may be formed on opposing sides of the dielectric layer 140. Solder balls or bumps 160b may then be formed on the trace layer 150. It should be noted that while a two-metal layer assembly is described for simplicity, in some embodiments, any number of metal layers can be used. For example, the dielectric layer 140 may be substituted with multiple alternating dielectric and conductive layers.

The die 110 is then aligned over the remainder of the package so that the solder balls or bumps 160a pass through the windows 132 of the conductive layer 130 without touching the conductive layer 130. The solder balls or bumps 160a are then mechanically and electrically coupled to the vias 144, such as through a solder reflow process or the like. In other embodiments, the solder balls or bumps 160a penetrate into and are directly electrically and mechanically connected to the vias 144, such as to the tapered side walls described above.

An underfill layer (similar to layer 20 in FIG. 1) may then be formed between the conductive layer 30 and the die 10, which will cover the sides of the die, similar to an encapsulation process.

The conductive layer 130 can be designed to have any desired characteristics. For example, the material and thickness of the conductive layer 30, as well as the size, shape, and placement of the windows 132 can be selected when designing the package. The conductive layer 130 can be designed to act as a ground plane, a power plane, a mechanical stiffener, an electromagnetic shielding plane, and/or a thermal conductor to aid in cooling of the package. The conductive layer may even be used to reduce noise.

Once assembled, the solder pads 112 on the die 110 are electrically coupled to the solder balls or bumps 160a, which are electrically coupled to the vias 144, which are electrically coupled to the trace layer 150, which is connected to solder balls or bumps (similar to 60b in FIG. 1), which are used to couple the package to a PCB (not shown). Therefore, in some embodiments, electrical paths are formed between the die 110 and the PCB (not shown). Accordingly, each electrical path extends through the thickness of the conductive layer 130 while being physically and/or electrically isolated from it.

The preceding description sets forth various implementations and embodiments. The implementations and embodiments described incorporate various elements and/or operations recited in the appended claims. The implementations and embodiments are described with specificity in order to meet statutory requirements. However, the description itself is not intended to limit the scope of this patent. Rather, the inventors have contemplated that the claimed invention might also be implemented in other ways, to include different elements and/or operations or combinations of elements and/or operations similar to the ones described in this document, in conjunction with other present or future technologies.

What is claimed is:

1. A multi-layered memory package, comprising:
   a die having multiple electrical connectors attached thereto;
   a dielectric layer comprising a dielectric layer first side and an opposing dielectric layer second side;
   electrical paths extending through the dielectric layer between the dielectric layer first side and the dielectric layer second side;
   a conductive layer disposed between the die and the dielectric layer first side, wherein the conductive layer defines a window for allowing the multiple electrical connectors to pass through the conductive layer to electrically couple to respective ones of the electrical paths without contacting the conductive layer.

2. The package of claim 1, wherein the electrical connectors include input or output connections to the die.

3. The package of claim 1, wherein the electrical connectors include contact pads.

4. The package of claim 1, wherein the conductive layer is electrically conductive.

5. The package of claim 1, wherein the conductive layer is thermally conductive.

6. The package of claim 1, wherein the conductive layer acts as a mechanical stiffener.

7. The package of claim 1, wherein the conductive layer is a foil layer.

8. The package of claim 1, wherein the conductive layer is made from a material selected from the group consisting of: alloy 42, FeNi36 (Invar), Cu, and Cu-Invar-Cu.

9. The package of claim 1, wherein the conductive layer is configured to act as a ground plane.

10. The package of claim 1, wherein the conductive layer is configured to act as a power plane.

11. The package of claim 1, wherein the window is disposed substantially at the center of the conductive layer.

12. The package of claim 1, wherein the window comprises a length of approximately 5 mm to 15 mm, and a width of approximately 0.10 mm to 3.0 mm, and the conductive layer comprises a thickness of approximately 5 microns to 150 microns.

13. The package of claim 1, wherein the window comprises a substantially rectangular shape.

14. The package of claim 1, wherein the die has multiple electrical connectors arranged in a row that is disposed along a length of the window.

15. The package of claim 1, further comprising a trace layer coupled to the dielectric layer second side.

16. The package of claim 1, wherein at least one of the electrical paths comprises a via that extends through the dielectric layer.

17. The package of claim 1, wherein at least one of the electrical paths comprises one or more traces, disposed on or in at least one of the layers of the package.

18. The package of claim 1, further comprising a solder ball coupled to the electrical path at the second side of the dielectric layer.

19. The package of claim 1, wherein the dielectric layer is a flex tape.

20. The package of claim 1, wherein the dielectric layer is made from a material selected from a group consisting of: polyimide, liquid crystal polymer, an FR-4 resin epoxy-based fiberglass composite, and a BT-based composite.

21. The package of claim 1, further comprising an underfill layer between the die and the conductive layer.

22. A semiconductor package, comprising:
   a non-conductive layer comprising a first side and an opposing second side;
   multiple first means for conducting electricity, the first means extending through the non-conductive layer from the first side to the second side;
   multiple second means for conducting electricity disposed at the second side, where each of the second means is electrically coupled to a different one of the first means;
   a semiconductor device electrically coupled to the second means; and
   a conductive layer disposed between the second side and the semiconductor device, wherein the conductive layer provides a means for allowing the second means to pass through the conductive layer to electrically couple to the first means without contacting the conductive layer.

23. A system comprising:
   one or more semiconductor packages, each comprising:
   a dielectric layer comprising a dielectric layer first side and an opposing dielectric layer second side;
   multiple vias extending through the dielectric layer from the dielectric layer first side to the dielectric layer second side;
   multiple solder balls disposed at the dielectric layer second side, where each of the solder balls is electrically coupled to a different one of the vias;
   a die electrically coupled to the solder balls;
   a conductive layer disposed between the dielectric layer second side and the die, wherein the conductive layer defines a window there through for allowing the solder balls to pass through the conductive layer to electrically couple to the vias without contacting the conductive layer;

an underfill layer between the die and the conductive layer; and a trace layer coupled to the dielectric layer first side, where the trace layer is electrically coupled to the vias.

24. A method of forming a semiconductor package, comprising:

forming a trace layer and a conductive layer on opposite sides of a dielectric layer, the conductive layer having a window, the dielectric layer having electrical paths extending between the opposite sides thereof; and aligning a die having electrical connectors attached thereto over the conductive layer so that the electrical connectors pass through the windows window to electrically couple with respective ones of the electrical paths without touching the conductive layer.

25. The method of claim 24, wherein the dielectric layer is formed with a single layer of dielectric material.

26. A system comprising:

one or more semiconductor packages, each comprising:

a dielectric layer comprising a dielectric layer first side and an opposing dielectric layer second side, wherein the dielectric layer includes multiple alternating dielectric and conductive layers;

multiple vias extending through the dielectric layer from the dielectric layer first side to the dielectric layer second side;

multiple solder balls disposed at the dielectric layer second side, where each of the solder balls is electrically coupled to a different one of the vias;

a die electrically coupled to the solder balls;

a conductive layer disposed between the dielectric layer second side and the die, wherein the conductive layer defines a window there through for allowing the solder balls to pass through the conductive layer to electrically couple to the vias without contacting the conductive layer;

an underfill layer between the die and the conductive layer; and a trace layer coupled to the dielectric layer first side, where the trace layer is electrically coupled to the vias.

27. The method of claim 24, further comprising forming an underfill layer between the die and the conductive layer.

28. The method of claim 24, further comprising configuring the semiconductor package such that the conductive layer acts as at least one of the group consisting of: a ground plane, a power plane, a mechanical stiffener, an electromagnetic shielding plane, and a thermal conductor for the semiconductor package.

* * * * *

UNITED STATES PATENT AND TRADEMARK OFFICE
CERTIFICATE OF CORRECTION

| | | |
|---|---|---|
| PATENT NO. | : 8,063,481 B2 | |
| APPLICATION NO. | : 12/526234 | |
| DATED | : November 22, 2011 | |
| INVENTOR(S) | : Li | |

It is certified that error appears in the above-identified patent and that said Letters Patent is hereby corrected as shown below:

In the Claims, Column 7, line 13, please delete "windows"

Signed and Sealed this
Thirty-first Day of January, 2012

David J. Kappos
*Director of the United States Patent and Trademark Office*